(12) United States Patent
Archambeault et al.

(10) Patent No.: US 7,921,390 B2
(45) Date of Patent: *Apr. 5, 2011

(54) METHOD AND SYSTEM FOR CREATING, VIEWING, EDITING, AND SHARING OUTPUT FROM A DESIGN CHECKING SYSTEM

(75) Inventors: Bruce Archambeault, Four Oaks, NC (US); Thaddeus Chen, Wappingers Falls, NY (US); Michelle K Cook, Georgetown, TX (US); Charles R Gates, Poughkeepsie, NY (US); Derrick D Scott, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 592 days.

This patent is subject to a terminal disclaimer.

(21) Appl. No.: 11/935,865

(22) Filed: Nov. 6, 2007

(65) Prior Publication Data

US 2008/0066042 A1    Mar. 13, 2008

Related U.S. Application Data

(63) Continuation of application No. 10/707,776, filed on Jan. 12, 2004, now Pat. No. 7,315,990.

(51) Int. Cl.
*G06F 17/50* (2006.01)
(52) U.S. Cl. .................................. 716/106; 716/111
(58) Field of Classification Search .............. 716/1, 5, 716/11, 106, 111; 717/109, 115, 125
See application file for complete search history.

(56) References Cited

U.S. PATENT DOCUMENTS

| | | | |
|---|---|---|---|
| 4,873,643 A | 10/1989 | Powell et al. | |
| 5,655,063 A | 8/1997 | Crocker | |
| 5,974,243 A | 10/1999 | Moh et al. | |
| 6,045,584 A | 4/2000 | Benzel et al. | |
| 6,055,366 A | 4/2000 | Le et al. | |
| 6,077,307 A | 6/2000 | Benzel et al. | |
| 6,282,696 B1 | 8/2001 | Garza et al. | |
| 6,370,496 B1 | 4/2002 | Carlson | |
| 6,415,421 B2 | 7/2002 | Anderson et al. | |
| 6,418,551 B1 | 7/2002 | McKay et al. | |
| 6,453,457 B1 | 9/2002 | Pierrat et al. | |
| 6,539,521 B1 | 3/2003 | Pierrat et al. | |
| 6,557,162 B1 | 4/2003 | Pierrat | |
| 6,907,589 B2 | 6/2005 | Frank et al. | |
| 7,076,410 B1 | 7/2006 | Kerzman et al. | |
| 7,076,749 B2 | 7/2006 | Kemerer et al. | |
| 2006/0236276 A9 * | 10/2006 | Frank et al. | 716/5 |

* cited by examiner

*Primary Examiner* — Vuthe Siek
(74) *Attorney, Agent, or Firm* — DeLio & Peterson, LLC; Robert Curcio; Wenjie Li

(57) ABSTRACT

Existing text output from a design rule checker is put in appropriate input format, and automatically displayed as text within a design tool using existing design tool capabilities, such as highlighting, zooming, and drawing box-regions. A graphical display of the output of the rule checker includes the informative text. Design rule violations are listed in a manner in which they can be individually selected. The output is displayed on a unique software program layer within the design tool so as to not effect or make any permanent changes to the original design file. The layers can be safely deleted when no longer in use.

26 Claims, 14 Drawing Sheets

METHOD AND SYSTEM FOR CREATING, VIEWING, EDITING, AND SHARING OUTPUT FROM A DESIGN CHECKING SYSTEM

BACKGROUND OF INVENTION

This invention relates to the field of printed feature manufacturing, such as printed circuit boards and integrated circuitry manufacturing. In particular, this invention relates design tools for printed circuit board layouts and integrated device layouts. More specifically, the invention relates to graphically identifying each violation of a design rule to a user using the output of a design rule checker.

Computer aided design (CAD) software programs are used to create design drawings such as electrical schematics. To fabricate either a printed circuit board or an integrated circuit (IC), engineers first use a logical electronic design automation (EDA) tool, to create a schematic design, such as a schematic circuit design or layout. The layout typically contains data layers that correspond to the actual layers to be fabricated in the circuit board or circuit. Such designs usually have to adhere to a set of predefined criteria, referred to as design rules, which are unique to the product, product type, or manufacturing process. Various techniques have been developed to ensure conformance to design rules. These techniques include the use of design rule checking programs run subsequent to the design creation and the use of interactive design rule checking procedures run continually during the design process.

Once the layout is created, the layout is verified to ensure that the layout has been properly executed and that the final layout created adheres to certain geometric design rules. These layout verifications are called design rule checks. Such tools are available from CADENCE DESIGN SYSTEMS and from MENTOR GRAPHICS. In these tools a number of physical design rule checkers exist. These rule checkers compare actual design data against a user or default-specified set of design parameters and output any non-complying features as violations. When anomalies or errors are discovered by these checking tools, the designer must repair the fault before the layout is sent out for circuit manufacturing and wafer fabrication. Design rule checking searches the design for violations of a predetermined set of conditions, for example, minimum line widths and minimum separations, and returns a result indicating whether design rule violations were found. The intermediate layer(s) associated with a design rule checker can store a list of design rule errors found, or a modified design that satisfies the design rules.

The design rule checker is typically a software program or module, which is provided by an established vendor or specially programmed. The design rule checker is adapted to receive a digital representation of the layout pattern to be analyzed. Such representations specify in a standard format the coordinates of defined edges on a pattern or other geometric features. Generally, the layout design is provided in a digital form to a design rule checker set to select only those features that violate the design rules. In U.S. Pat. No. 6,282,696 issued to Garza, et al., on Aug. 28, 2001, entitled "PERFORMING OPTICAL PROXIMITY CORRECTION WITH THE AID OF DESIGN RULE CHECKERS," a design rule checker is used to locate features of an integrated circuit layout design meeting predefined criteria. A partial layout is created as a new file having coordinates for each small feature under consideration. However, graphical assistance in dealing with violations identified by the design rule checker is neither taught nor suggested.

One problem with these design rule checkers is that a majority of them output the violations as a text file. Reviewing the output of these design rule checkers requires significant time on the part of the user to locate and understand the violation by using the text output to manually interact with the design file. A few design rule checkers also output some graphical information, but in most cases this information is limited to a pointer that identifies a problem location without providing data related to any specifics about the violation. An example of this type of output is demonstrated by the CADENCE ALLEGRO™ DRC (design rule checker). In these types of systems, the location of the violation is given, but useful information concerning the violation remains unknown to the user.

In U.S. Pat. No. 6,415,421 issued to Anderson, et al., on Jul. 2, 2002, entitled "INTEGRATED VERIFICATION AND MANUFACTURABILITY TOOL," a hierarchical database is taught to store shared design data accessed by multiple verification tool components, such as design rule check. The database includes representations of one or more additional, or intermediate layer structures that are created and used by the verification tool components for operations performed on the design being verified. Once again, however, graphical representations of violations are not suggested or taught.

Generally, the output of design rule checkers is a one-time-only output, either in a text file or in a view of the design file within the design environment. There are no utilities within the violation review process for a user to create a desired subset of those violations that could then be shared with a designer. The user is typically forced to manually edit the original text output and give the resulting list to the designer, who must repeat the process of manually locating and understanding the violations. Often, when reviewing a list of violations, the user needs to obtain more information about a particular violation, such as inquiring about the neighboring features or some of the properties associated with the violating feature. With traditional violation reviewing, the user enters a number of keystrokes to get this information. If in the process of obtaining this information, the view of the design changes significantly, such as scrolling to a different location within the design, manual effort is required to relocate the violation in question.

Consequently, there is a need in the art to take the output of a design rule checker and graphically identify each violation to the user using design tool operations.

Bearing in mind the problems and deficiencies of the prior art, it is therefore an object of the present invention to provide a graphical method for viewing and editing output from a design rule checking system.

It is another object of the present invention to provide a system and method that takes a text file from a design rule checker and graphical displays violations to a user.

A further object of the invention is to provide an interactive graphic tool using the output of a design rule checker to allow multiple users to view output without re-running the rule checking software.

It is yet another object of the present invention to provide a non-destructive interactive graphical tool to allow a designer to work with design rule checking output without risking existing data.

Another object of the present invention is to allow a user to view a design violation from any rule-checking tool that outputs in compatible format.

Still other objects and advantages of the invention will in part be obvious and will in part be apparent from the specification.

SUMMARY OF INVENTION

The above and other objects, which will be apparent to those skilled in art, are achieved in the present invention which is directed to a method of using text from a design tool to display an output to a user, the method comprising: graphically displaying the output from the text of the design tool; graphically listing design rule violations; displaying the output as part of a software layer of the design tool such that no permanent changes are made to any original design file; generating and annotating a subset output file for use by other users; and generating software help functions allowing the user to gain information about design rule violations. The design tool may be a design rule checking system. The text comprises text output from the design tool. The text output from the design tool comprises an input file for software implementing the method. The method further includes individually selecting the design rule violations. The output may be represented as part of the software layer of the design tool and deleted when no longer required. The software layer may be presented in a pop-up window display. The pop-up window includes information identifying the design rule violations, net name, component name, information relating to design rules. The pop-up window further comprises the identification of parameters being checked along with information as to the parameters' importance. The method may include drawing a bounding box around any of the design rule violations. The subset output file may be loaded and viewed without running the design tool rule checker. The subset file may include saved information relating to an identified violation. The saved information may be shared electronically with different users. The identified violation may be requested by the user to be saved such that a resulting output file contains only those of the design rule violations that the user requested be saved, preserving the original design file. Software help functions may include highlighting, zooming, measuring cumulative distance between multiple points, changing viewpoints of a design, changing magnification level, changing feature visibility, and changing location of a viewport. The design rule violations may be reselected to return to an originally presented view.

In a second aspect, the present invention is directed to a method of viewing violations identified by a design rule checker comprising: inputting text output from the design rule checker into a software program routine for viewing the violations; inputting design file information into the software program routine; generating a subset output file of the violations for a user to view; and editing the design file based on the violations. The method may further comprise: inputting design data and rule checker parameters into a design rule checking tool; and performing design rule checking. The method includes generating a subset text output file of the violations and allowing the user to individually select the violations. The output may be represented as part of a software layer of the design rule checker, and deleted when no longer required. The software layer may be presented in a pop-up window display.

In a third aspect, the present invention is directed to a program storage device readable by a machine, tangibly embodying a program of instructions executable by the machine to perform method steps for using text from a design tool to display an output to a user, the method steps comprising: graphically displaying the output from the text of the design tool; graphically listing design rule violations; displaying the output as part of a software layer of the design tool such that no permanent changes are made to any original design file; generating and annotating a subset output file for use by other users; and generating software help functions allowing the user to gain information about design rule violations. The text comprises text output from the design tool. The text output from the design tool comprises an input file for software implementing the method. The design rule violations may be individually selected.

In a fourth aspect, the present invention is directed to a program storage device readable by a machine, tangibly embodying a program of instructions executable by the machine to perform method steps for viewing violations identified by a design rule checker, the method steps comprising: inputting text output from the design rule checker into a software program routine for viewing the violations; inputting design file information into the software program routine; generating a subset output file of the violations for a user to view; and editing the design file based on the violations.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1:
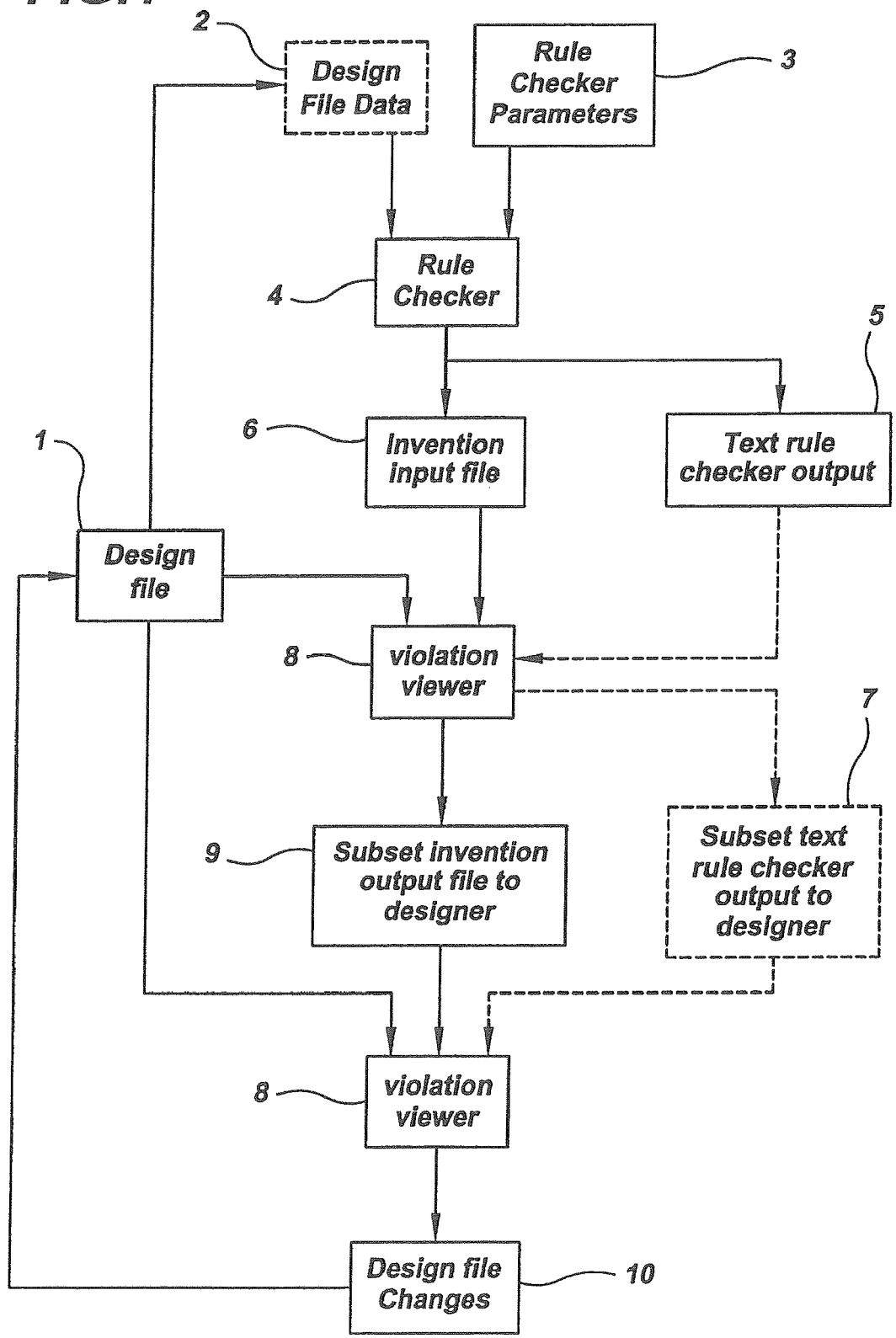
FIG. 1 depicts the overall process flow for the present invention.

In describing the preferred embodiment of the present invention, reference will be made herein to FIGS. 1-14 of the drawings in which like numerals refer to like features of the invention.

The present invention takes existing text output from a rule checker in appropriate input format, and automatically displays the text within the design tool using existing design tool capabilities, such as highlighting, zooming, drawing box-regions, and the like. Information is graphically associated with the rule checker text output. A graphical user interface output of the rule checker is then provided. The invention graphically displays the output of the rule checker including the informative text. Any violations are listed in a manner in which they can be individually selected. The output is displayed on a unique layer within the design tool so as to make no permanent changes to the original design file. The layers may be safely deleted when no longer in use. This process provides a user with means to annotate and output a subset file for use by other users and designers. For example, a designer may then load and view a subset file using the present invention, without having to run the rule checker. Useful helper functions are also provided, which allow the user or designer to gain more information about the design. These functions are generally available in the design tool; however, their implementation would normally involve a more intensive manual process.

Importantly, the present invention takes the output of the design rule checker and graphically identifies each violation to the user using design tool operations. The user selects from a list of violations, which may be presented in a pop-up window, and zooms the view to an appropriate level for the user to clearly see the violation, depending on the type of information contained in the rule checker file. This process highlights and effectively draws a bounding box around any violation in question if applicable. The pop-up window is made to contain information identifying the violation along with other pertinent information about it, such as the net name, component name, and the like, which will aid the user in understanding more about the violation. The pop-up window also contains information about the checked design rule, which helps the user to understand the violation. This information includes identifying the parameters being checked and information as to why these parameters are important. Importantly, the output file of the design rule checker must be in a format that can communicate with, and be processed by, the present invention. The output file of the design rule checker is the input file for the Invention. The user applies the rule checker text output to speed up and simplify the review of the design rule checker output.

The present invention generates an output file that allows the user to save information related to identified violations in order to share the information with a designer or other user. In this process, the user requests that a particular violation be saved. The resulting output file contains only those violations that the user requested to be saved. A new user reviewing this subset file can then view precisely what the first user experienced. The original file is preserved. Consequently, the creation of this subset file is repeatable for multiple, unique output files.

Normally, extensive user interaction is necessary to obtain additional information about the violating feature or surrounding features. This interaction generally requires a substantial number of keystrokes, which need to be frequently repeated. The process of getting this additional information may, on occasion, cause the user to change the viewpoint of the design, either the magnification level, feature visibility, or location of the view port. The present invention affords multiple advantages here. First, "helper functions" are automatically integrated for common activities, such as zooming to a region, measuring cumulative distance between multiple points, resetting visibility, and the like. This integration saves input time and removes input mistakes by reducing the number of keystrokes necessary for input. Second, since a list of the violations is contained within a selectable popup window, the user need only reselect the violation to return to the originally presented view.

The issues addressed by the present invention enable a user to save significant time. Typically, timesavings can be upward of 75-90% of the original, manual review time.

Overall Process Flow

FIG. 1 depicts the overall process flow for the present invention. The invention input file 6 is a software tool that provides a graphical user representation for a printed circuit board design file 1 and the output of a design rule checker 4. The overall application of the invention is typically as follows: The user applies rule checker parameters 3 against a design file or some subset of the design file data 2 within a design rule checker 4. The rule checker 4 compares the design data 1, 2 against the rule checker parameters 3 and provides output to the user in text form 5 and in a standard file format specified for the input file 6. The present invention then a "violation viewer" methodology 8 that generates an output file 9 allowing the user to save information related to identified violations. This includes the data from the design file 1, and uses the input file 6 to graphically identify the rule checker output to the user.

When the user identifies particular violations that need to be shared with the designer, a portion of the "violation viewer" methodology 8 is used to create a subset output file 9 that contains only that violation information to be shared with the designer. If appropriate, a text version of this output 7 may also be generated. The designer operates the "violation viewer" methodology 8 similar to the original user, applying the subset output file 9 against the design file 1, using the text output 7 as an additional reference if needed. The designer identifies and performs necessary design file changes 10 on the design file 1. This process may then iterate through from the rule checking process as many times as is deemed necessary by the user.

Figure 2:
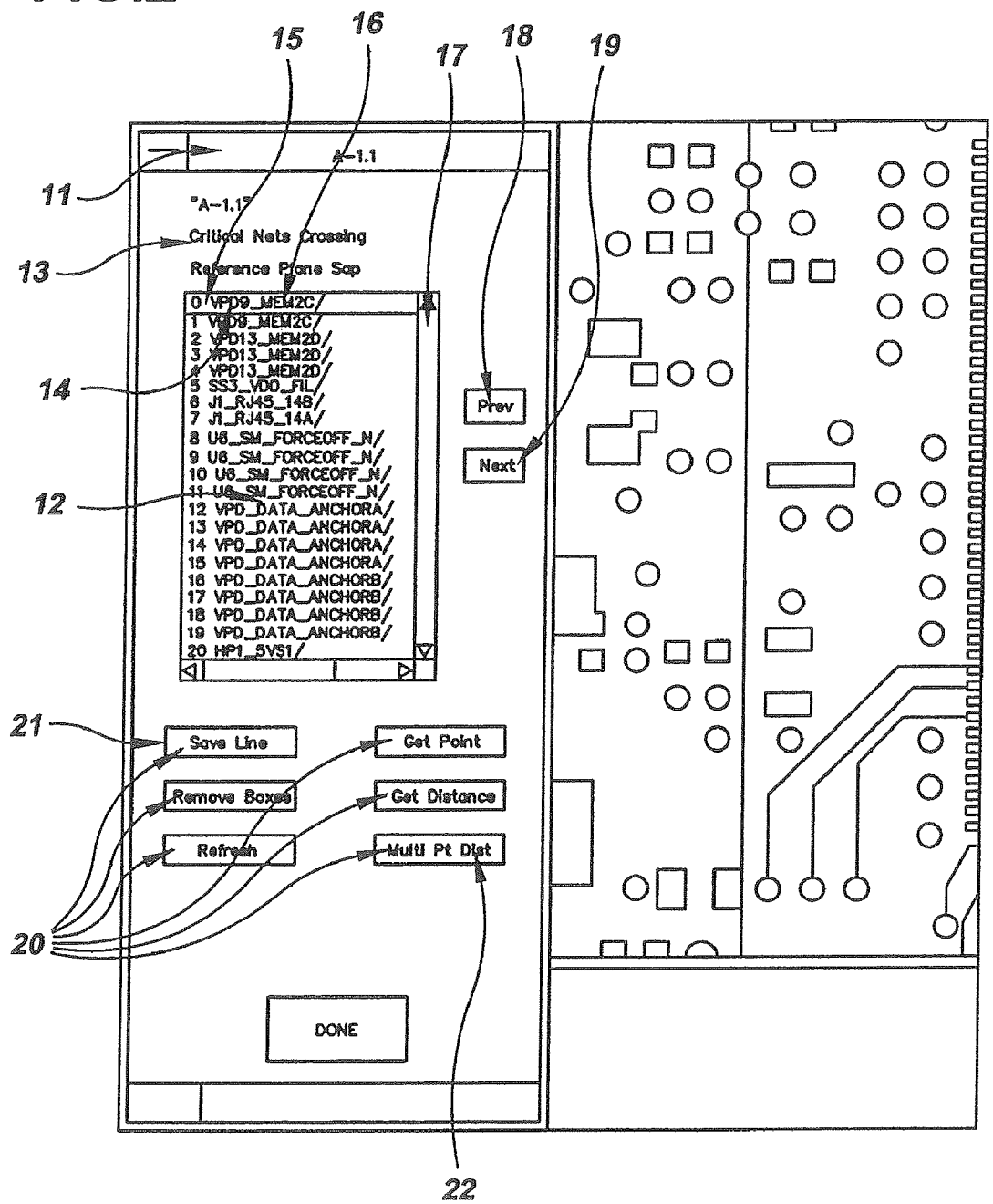
FIG. 2 depicts a pop-up window of violations to view and available to be chosen by the user.

Upon initializing the software to perform the methodology of the present invention, the user is presented with a pop-up window 11 as shown in FIG. 2, which lists the violations reported 12 along with some descriptive text 13 taken from the rule checker to identify the rule check performed. If the list 12 is longer than the window permits, a scroll bar 17 is provided to scroll through the list 12. The user may select a violation to be displayed, which will then be highlighted 1) either by selecting it with the mouse pointer, using the "up" and "down" arrow keys on the keyboard, or with the Prev (ious) 18 and Next 19 clickable software buttons. For each violation, useful information such as an identifier number 15 and violation description 16 is shown in the list 12 as provided by the rule checker output 6. The graphical representation of the rule checker output 6 can be shown to the user in a variety of ways. The software for the present invention is designed to interact with the design file software using the design file software's various capabilities.

Figure 3:
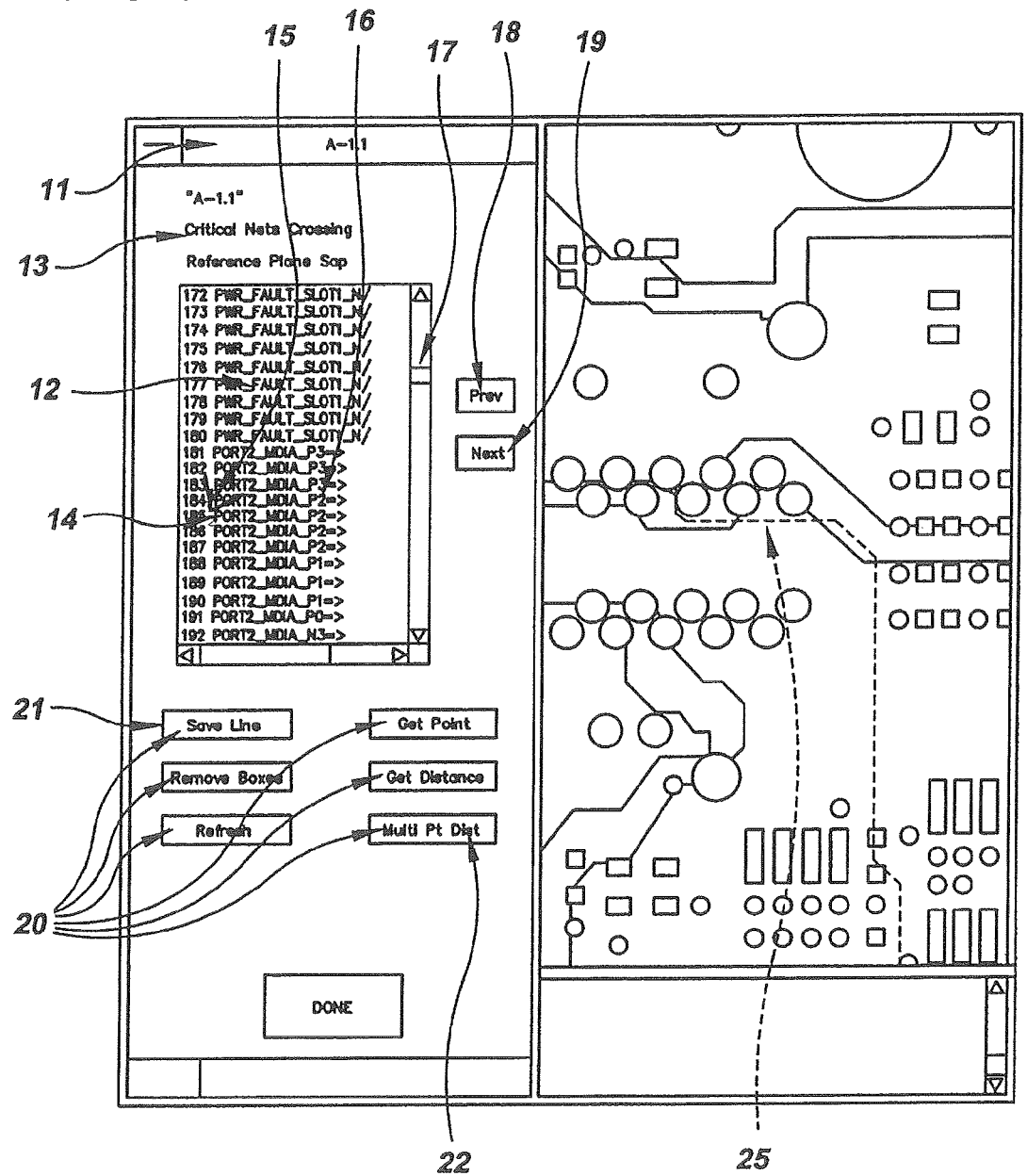
FIG. 3 depicts the pop-up window of FIG. 2 with a sample violation viewing along with a highlighted feature pertinent to the violation.
Figure 4:
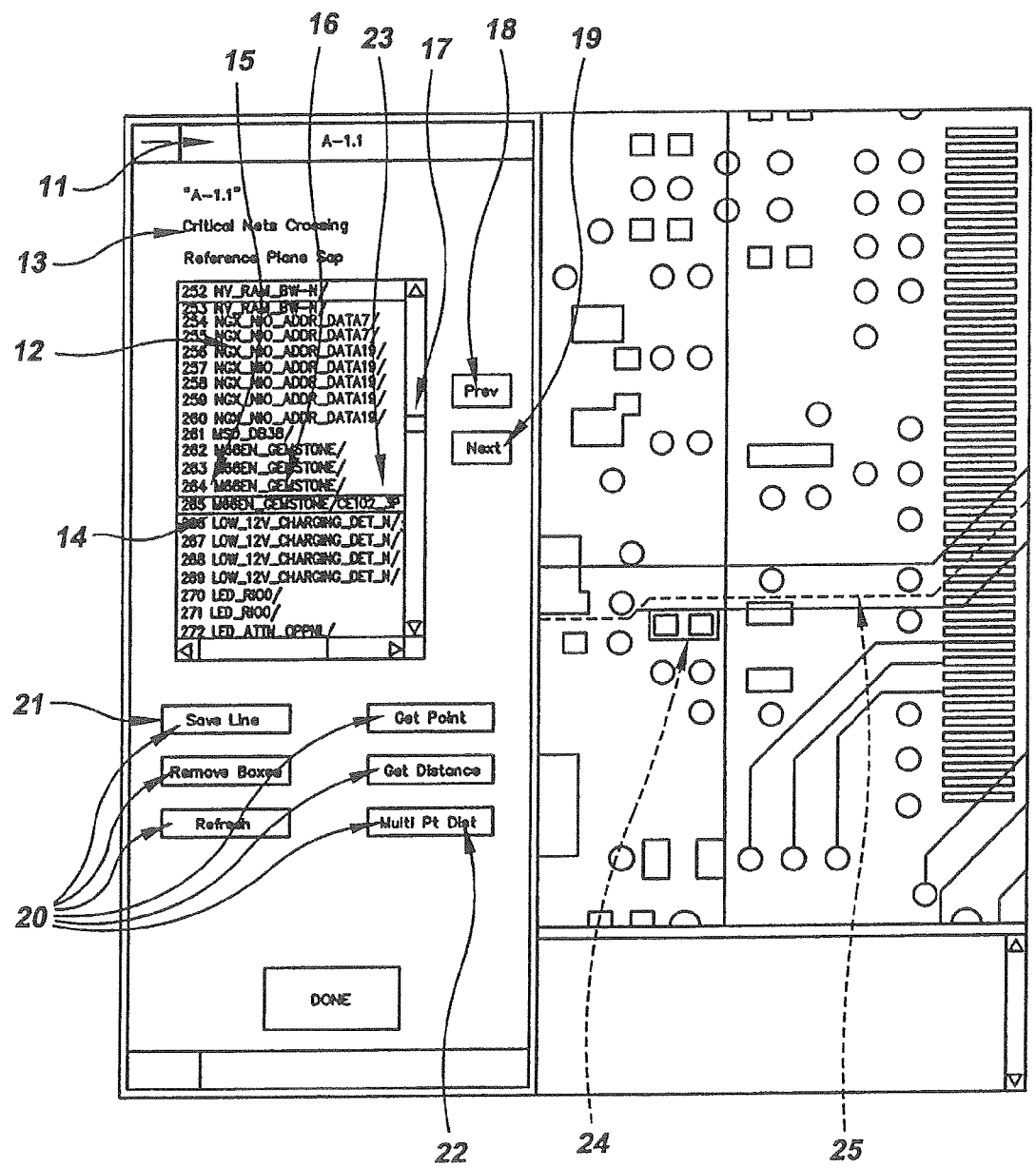
FIG. 4 depicts the pop-up window of FIG. 2 with general highlighting and boxing of first and second violation features.
Figure 5:
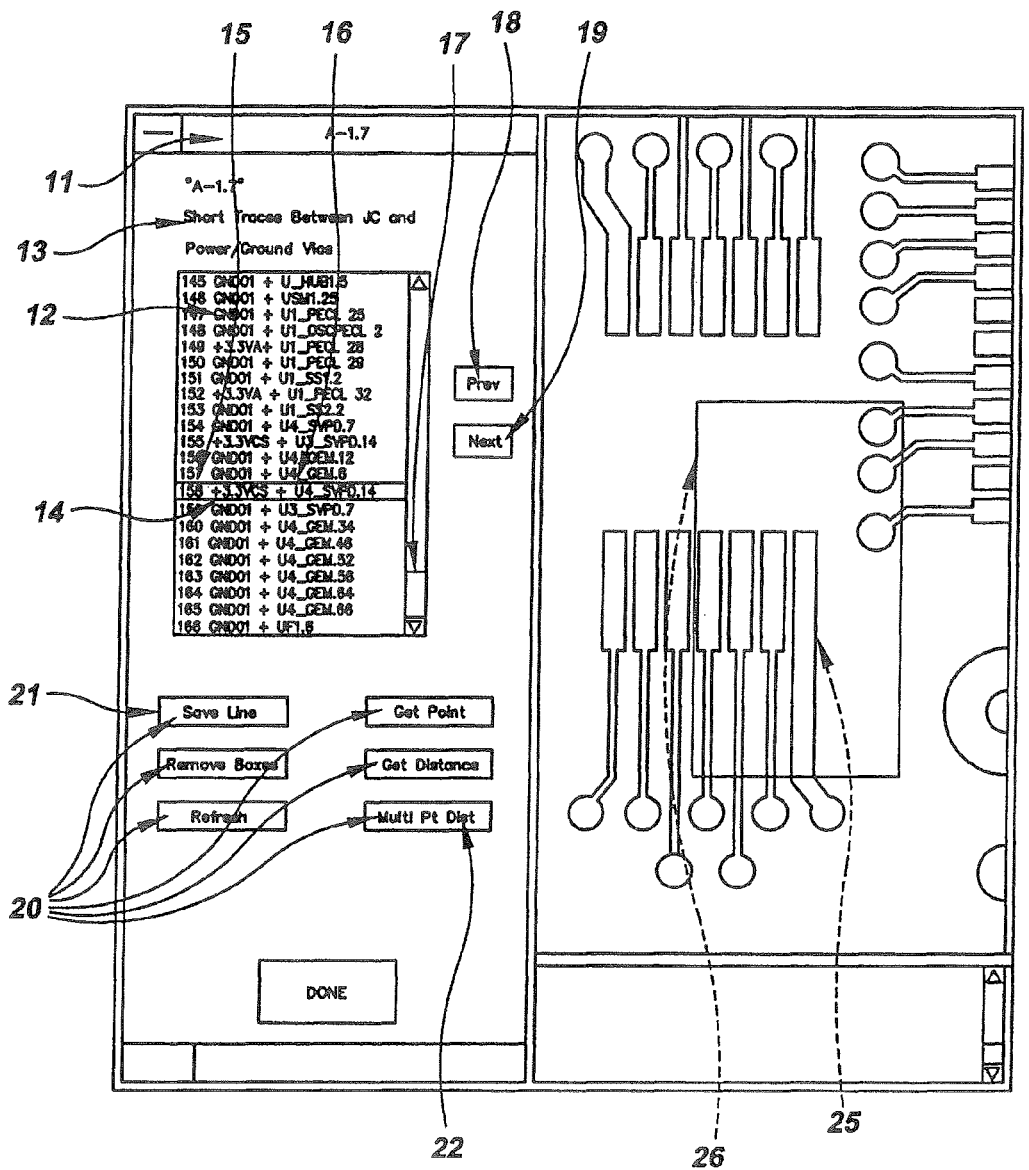
FIG. 5 depicts the pop-up window of FIG. 2 with a bounding box around a region pertinent to the violation.
Figure 6:
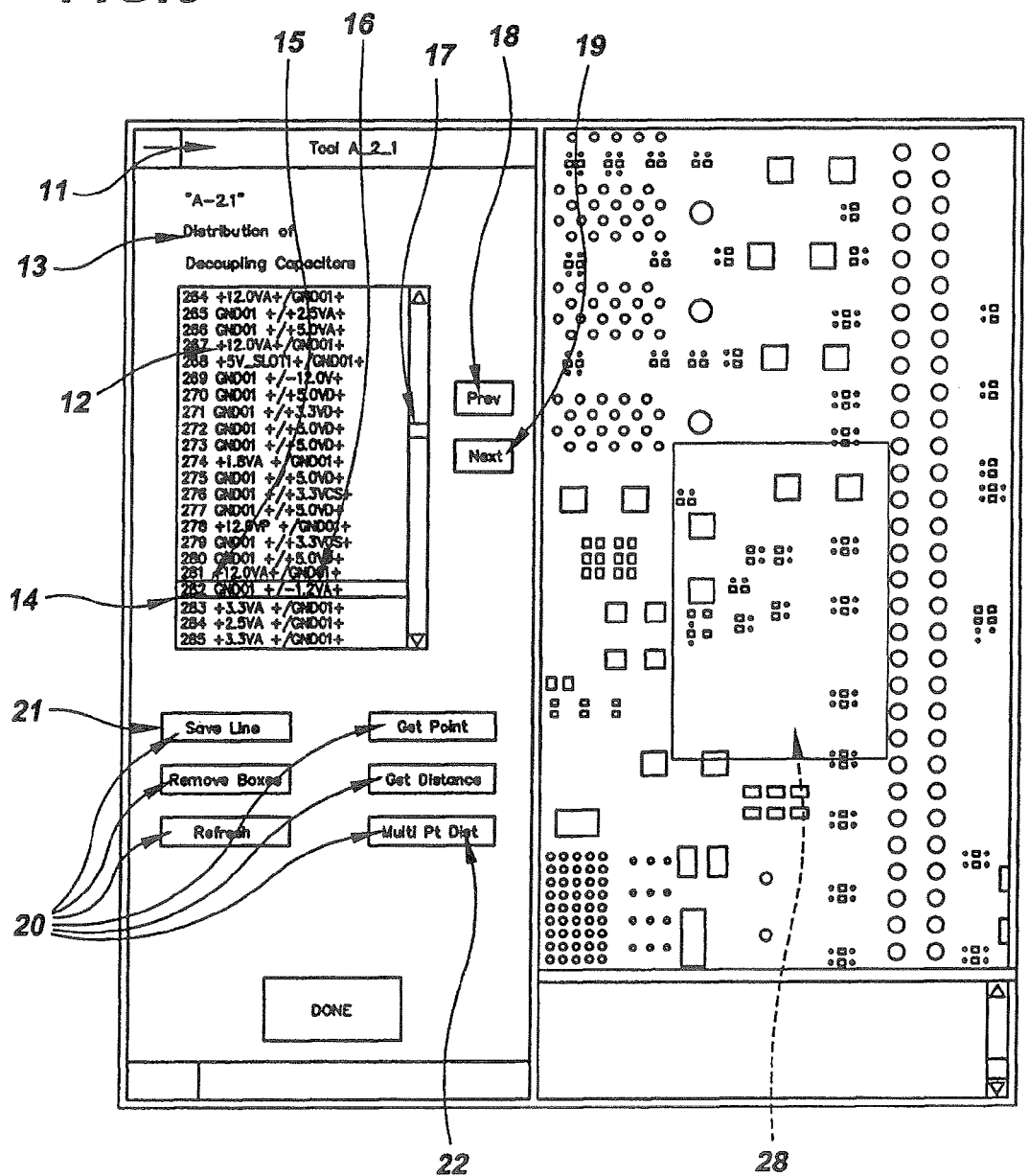
FIG. 6 depicts the pop-up window of FIG. 2 having a box drawn to show a feature search region.
Figure 7:
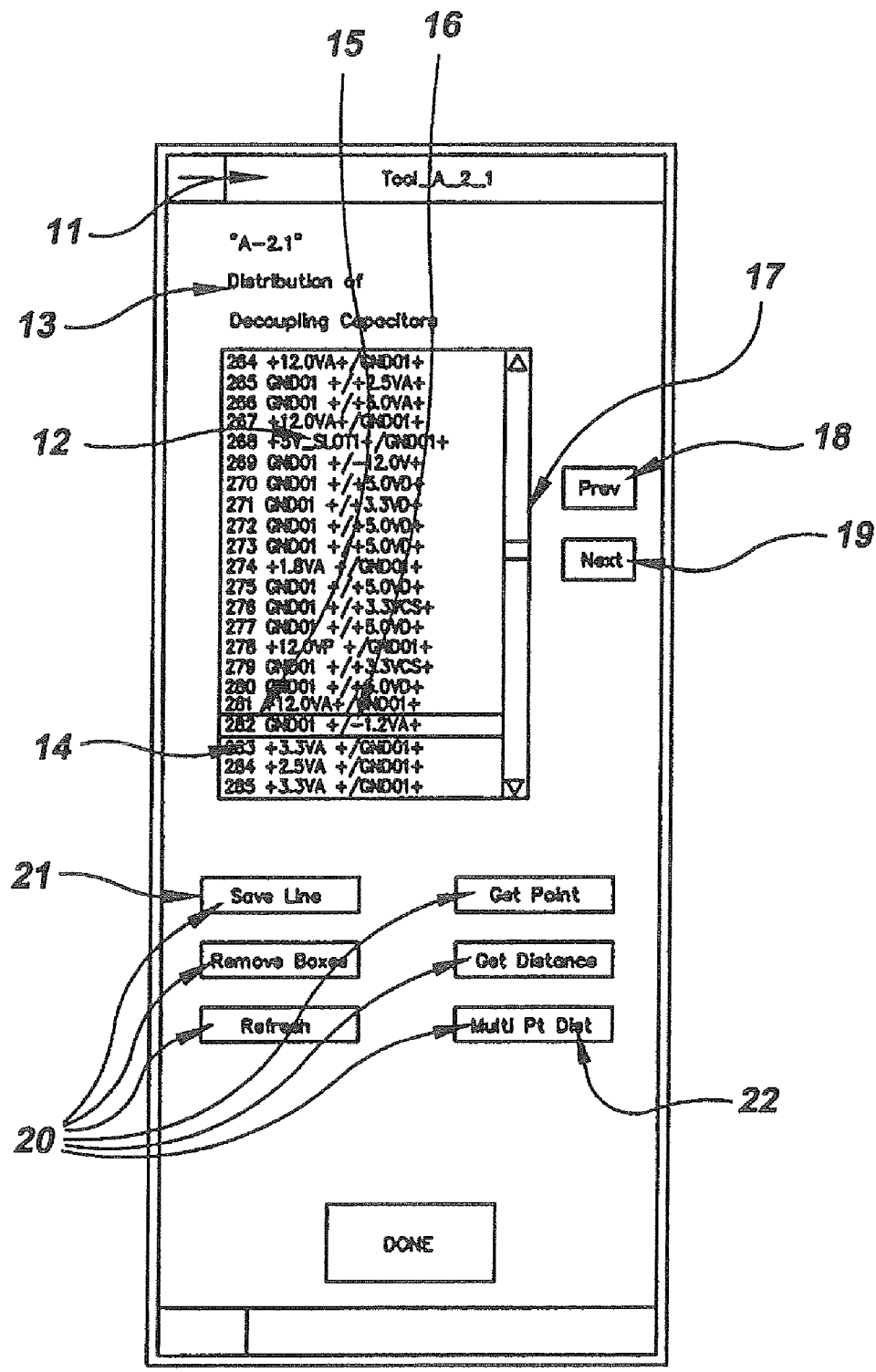
FIG. 7 depicts a portion of the pop-up window of FIG. 2 showing basic helper function soft-keys, including a "save line" feature.

A feature central to the violation 25 may be highlighted as depicted in FIG. 3. Where a violation contains a main description 16 and a secondary feature related to the violation 23, both highlighting of the main feature 25 and highlighting and/or the drawing of a small box around the secondary feature 24 can be performed. This is shown in FIG. 4. If a bounding region is pertinent to the violation, a bounding box of prescribed distance may be drawn around the key feature 26. FIG. 5 depicts a bounding box around the region. In this example, a box is drawn around a component pin at a distance from all sides of the pin. If the violation relates to the lack of a desired feature that should be located within a region, a bounding box representing the checked region may be drawn 28, as depicted in FIG. 6. The box is drawn to indicate a feature search region based on a set of grid coordinates specified by the rule checker. The box drawn 28 represents one grid box in the overall grid. In addition to these graphical representation capabilities, the invention methodology also provides the user with the ability to output a subset list of the violations that need further communication 7, 9. This output file is created with the "save line" software button 21 on the main pop-up window 11 as shown in FIG. 7. Once created, the subset output 9 may be viewed graphically within the design tool. The user accesses this ability primarily through an additional helper function pop-up window 38 shown in FIG. 8. The helper functions include an initial set "Goto Point", "Get Distance", and "Reset Find Filter", and additional helper functions including "Start Vioviewer", "Outline ON/OFF", "Show Comp", "Show Comp Info", "Show Decaps", "Show Pin", "Show Net", "Show Net Info", "Show Seg", "Get Layer Thick", "Sublayer Thick", and "Done".

The "Goto Point" allows the user to input an x- and y-coordinate and zooms such that the selected coordinate is at the screen's center. The "Get Distance" allows the user to select two points on the screen, returning the distance between the selected two points. The "Reset Find Filter" resets the state of the selection feature. The "Outline On/Off" toggles the design element called "outline" to an on or off state. The "Show Comp" allows the user to input a component identifier, and zooms the display such that the component is at the center of the screen and highlighted. The "Show Comp Info" allows the user to input a component identifier, and returns a pop-up window containing the component properties. The "Show Decaps" highlights decoupling capacitors connected to the net specified by the user. The "Show Pin" takes the user input of a component pin, and zooms so that the pin is in the center of the screen and highlighted. "Show Net" takes the user input of a net, and zooms so that the net is in the center of the screen and highlighted. "Show Net Info" allows the user to input a net identifier, and returns a pop-up window containing the net properties. "Show Seg" takes the user input of a net segment, and zooms so that the net segment is in the center of the screen and highlighted. "Get Layer Thick" allows the user to select a layer identifier and returns the thickness dimension from the design data. "Sublayer Thick" allows the user to select a sublayer identifier and returns the thickness dimension from the design data. "Done" closes the helper window.

Figure 9:
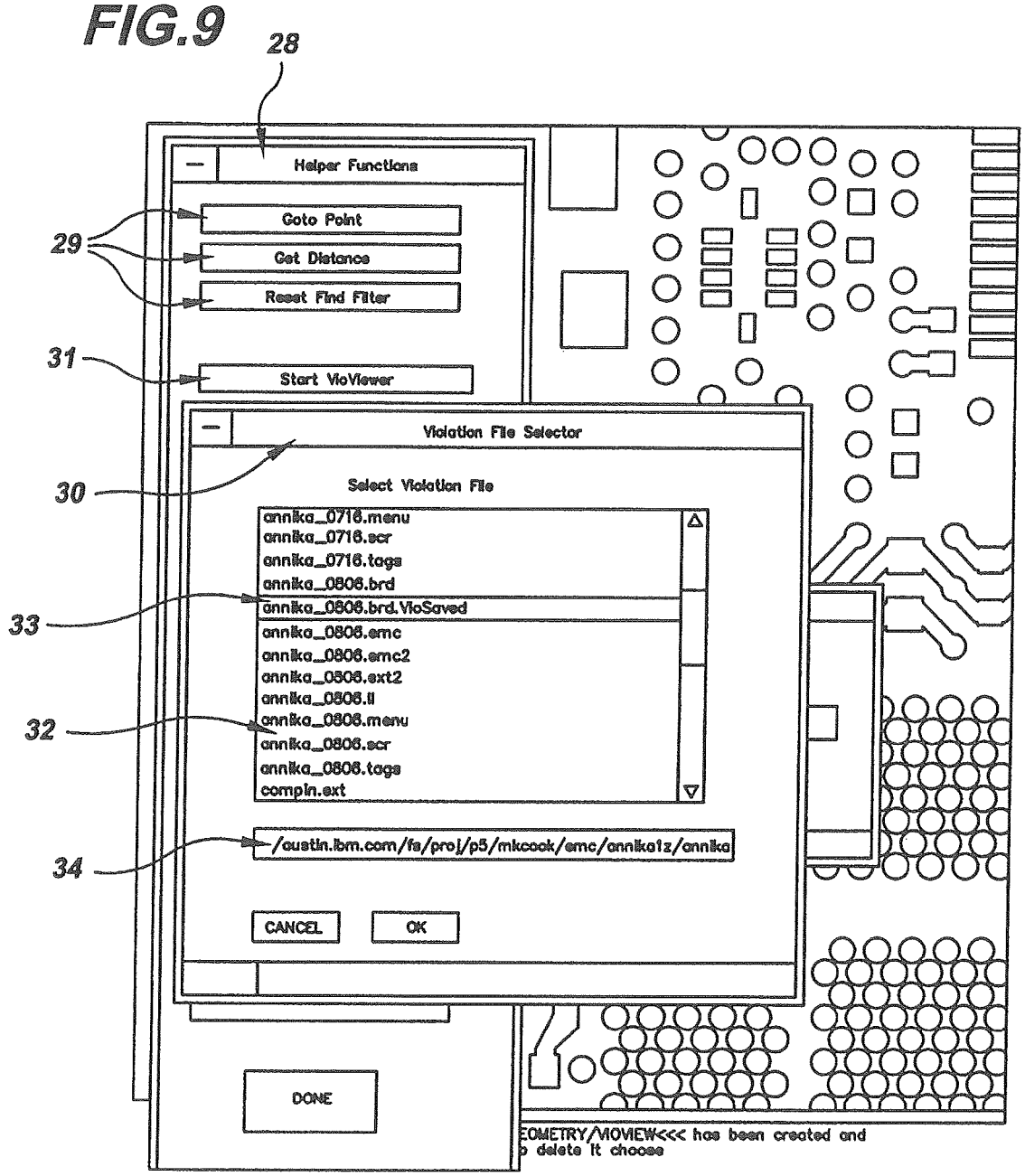
FIG. 9 depicts a sample viewing of the selection of a subset output file from the directory.
Figure 10:
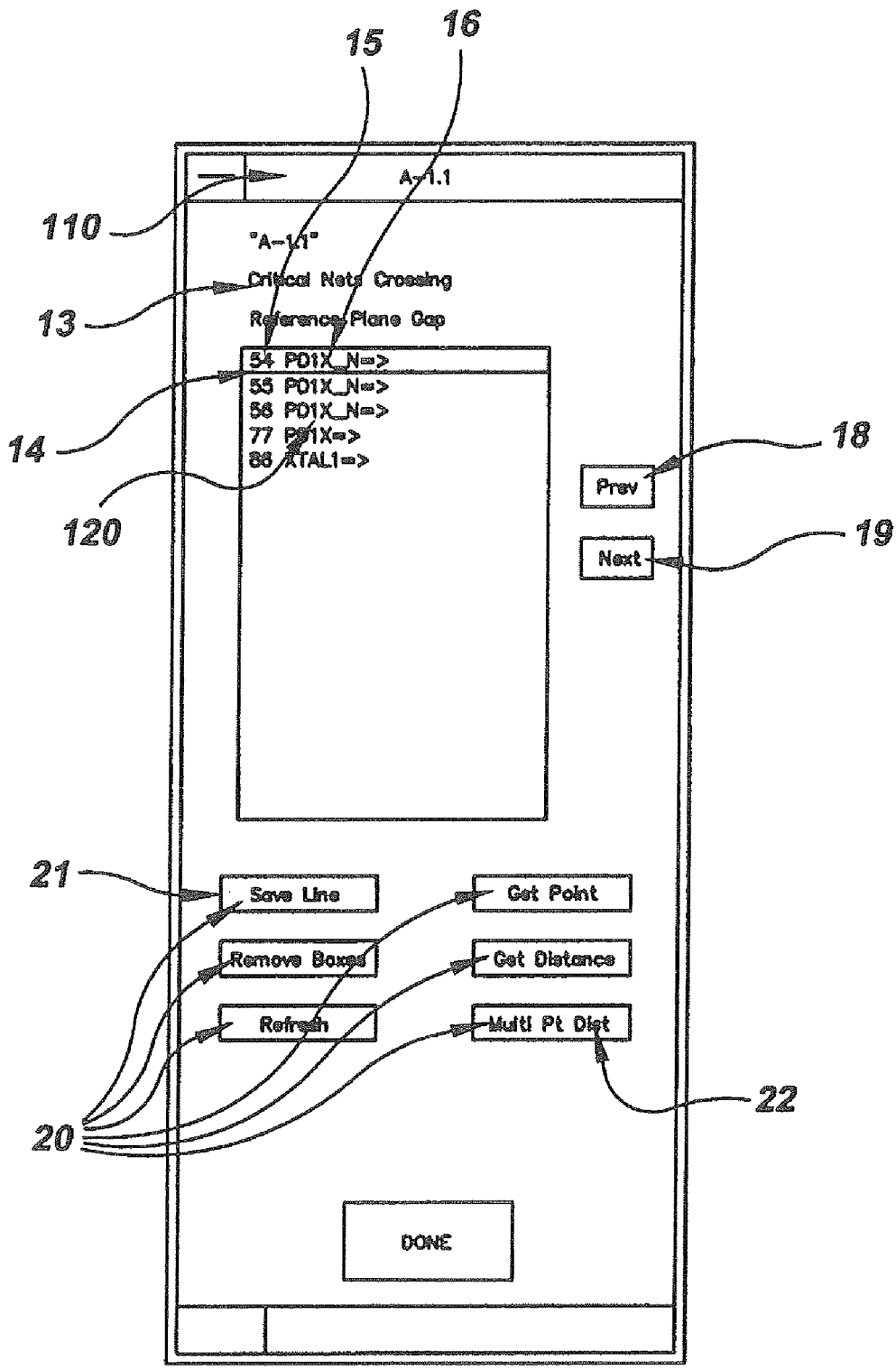
FIG. 10 depicts a sample violation pop-up window list showing the subset of the overall list specified by the user to communicate with the designer.

Along with an initial set of helper functions 29, a soft-key button "Start Vioviewer" 31 is programmed to start the viewing of the input files 6, 9. When this button is selected, a violation file selector pop-up window 30 is presented as seen in FIG. 9. This window shows a list of files 33 that may be selected. The subset files are created as separate files from the original input files. When the desired file is identified, it may be selected by clicking on it, which initiates loading it into the file path box 34. Alternatively, if the user knows the specific file path, he or she may type it directly into the file path box 34. Referring to FIG. 10, once started, the present invention operates on the subset file 9 and shows a similar pop-up box 110 to the violation list as shown previously. In this case, the violation list 120 contains only those in the subset output file 9. This can be seen in the violation list 120. FIG. 10 depicts the sample violation pop-up window list showing the subset of the overall list specified by a user to communicate with a designer.

Figure 8:
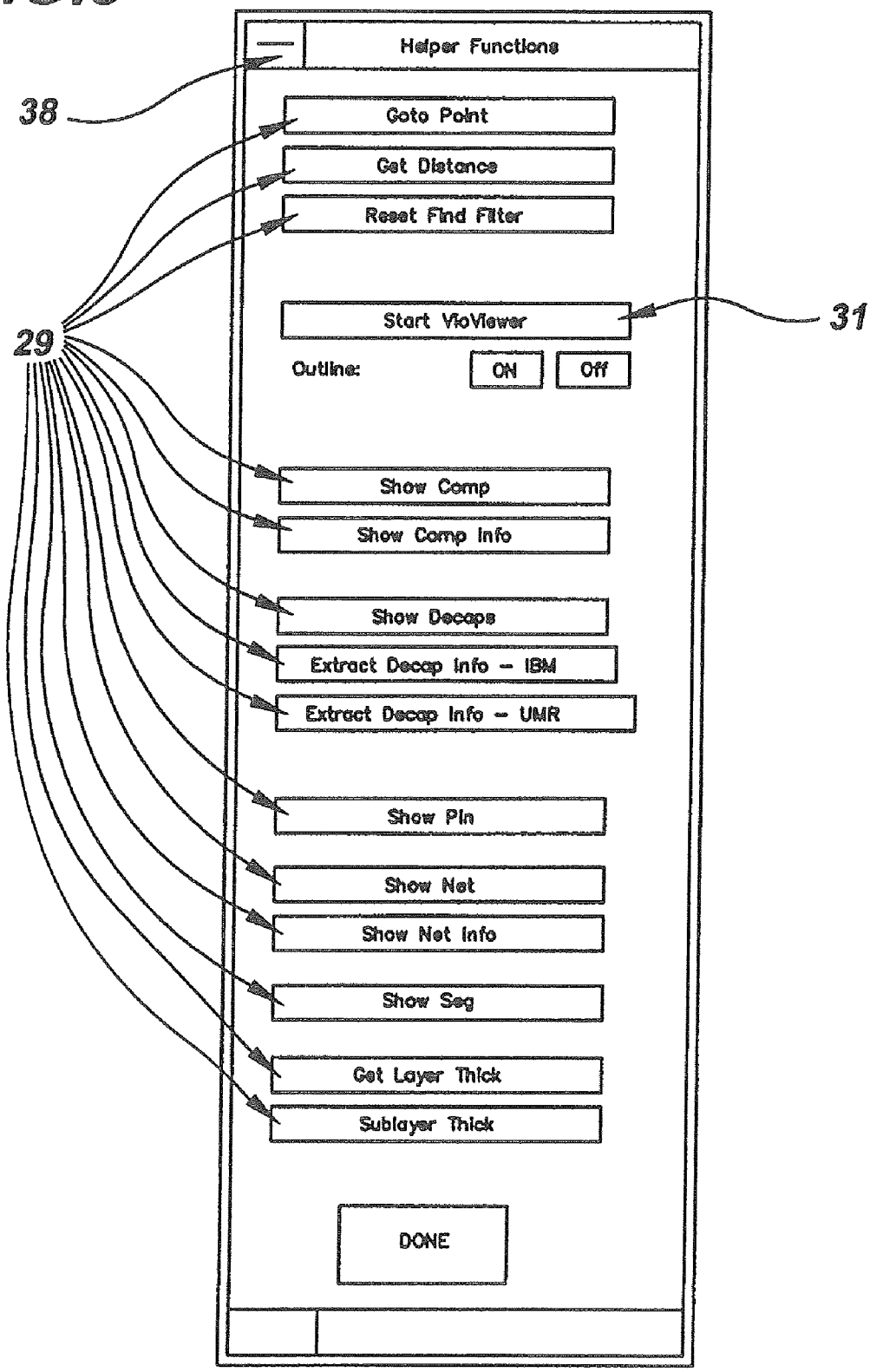
FIG. 8 depicts an additional helper function pop-up window with examples of helper function available to the user.
Figure 11:
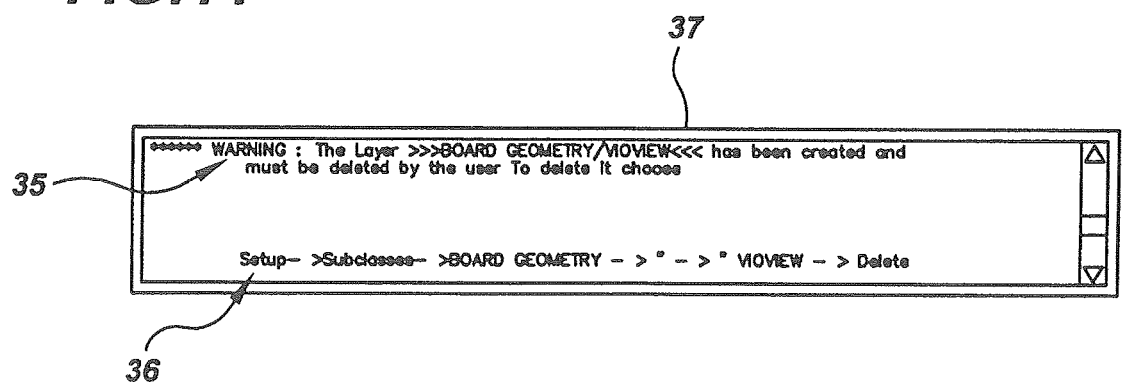
FIG. 11 depicts sample instructions for the Cadence Allegro design tool advising the user of the temporary layer created for viewing violations.
Figure 12:
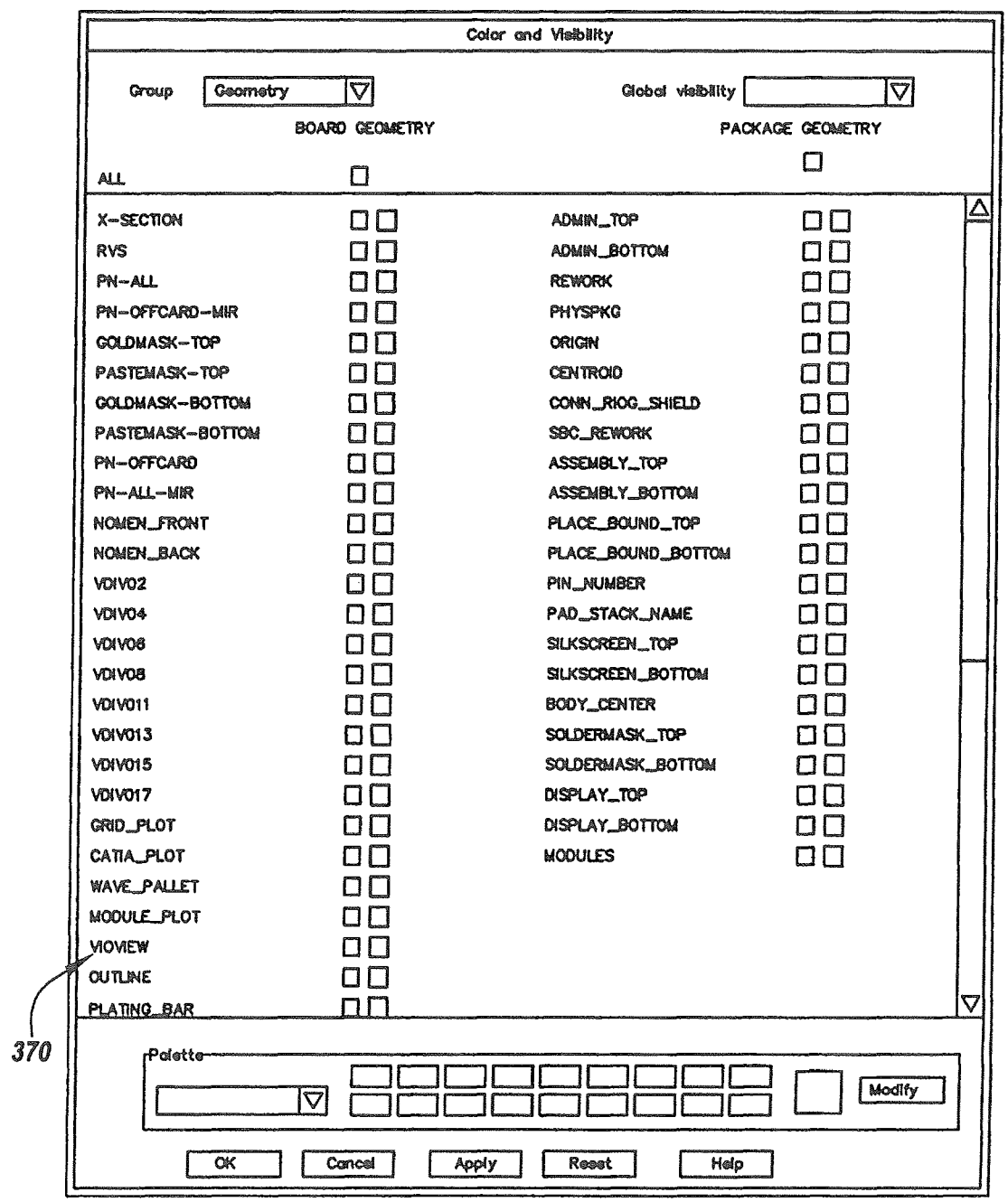
FIG. 12 depicts an example of a temporary layer created for viewing violations within the CADENCE ALLEGRO design environment that can be safely removed without making permanent, destructive changes to the original design.
Figure 13:
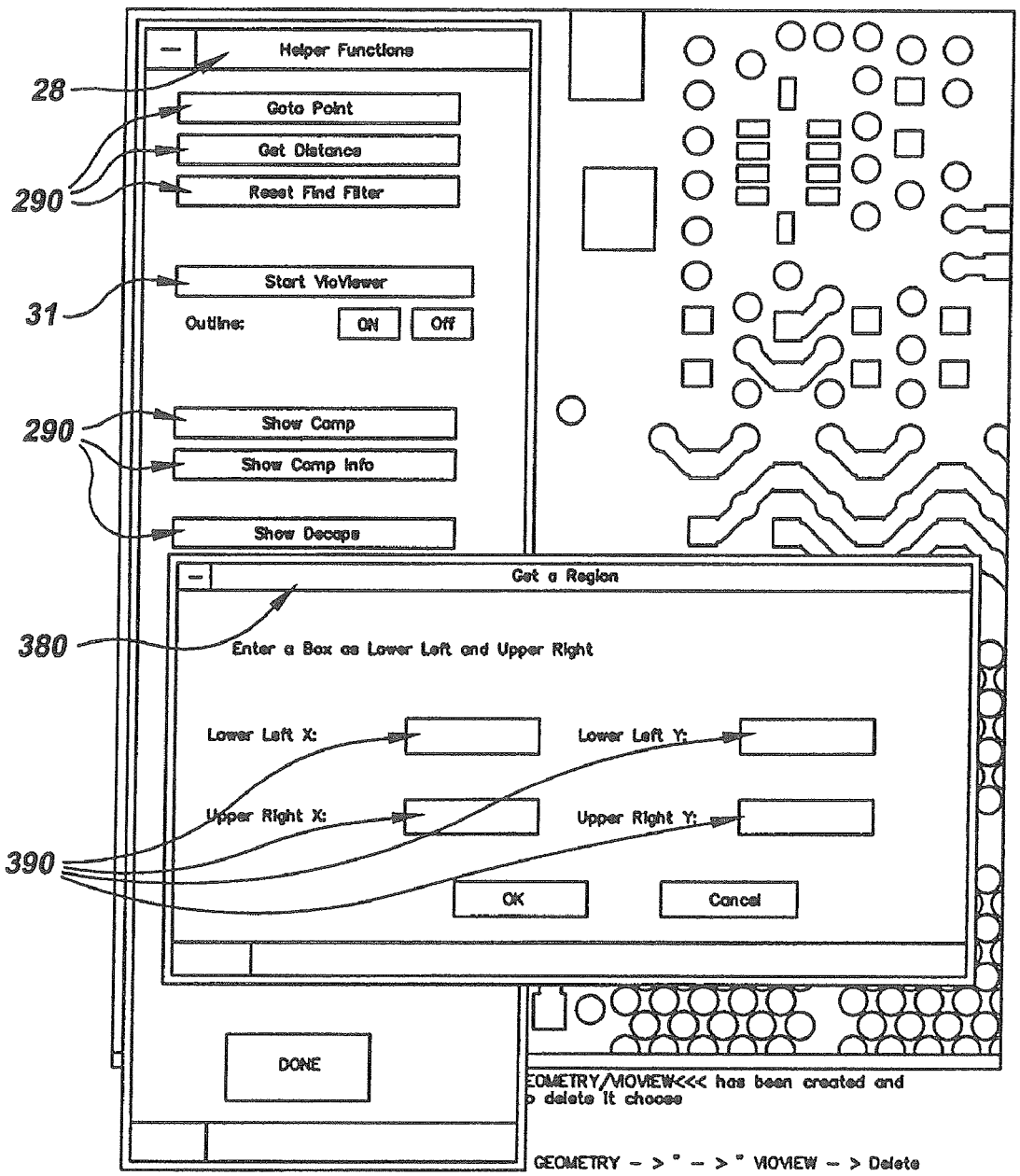
FIG. 13 depicts an example of helper function that has a bounding box as its input.
Figure 14:
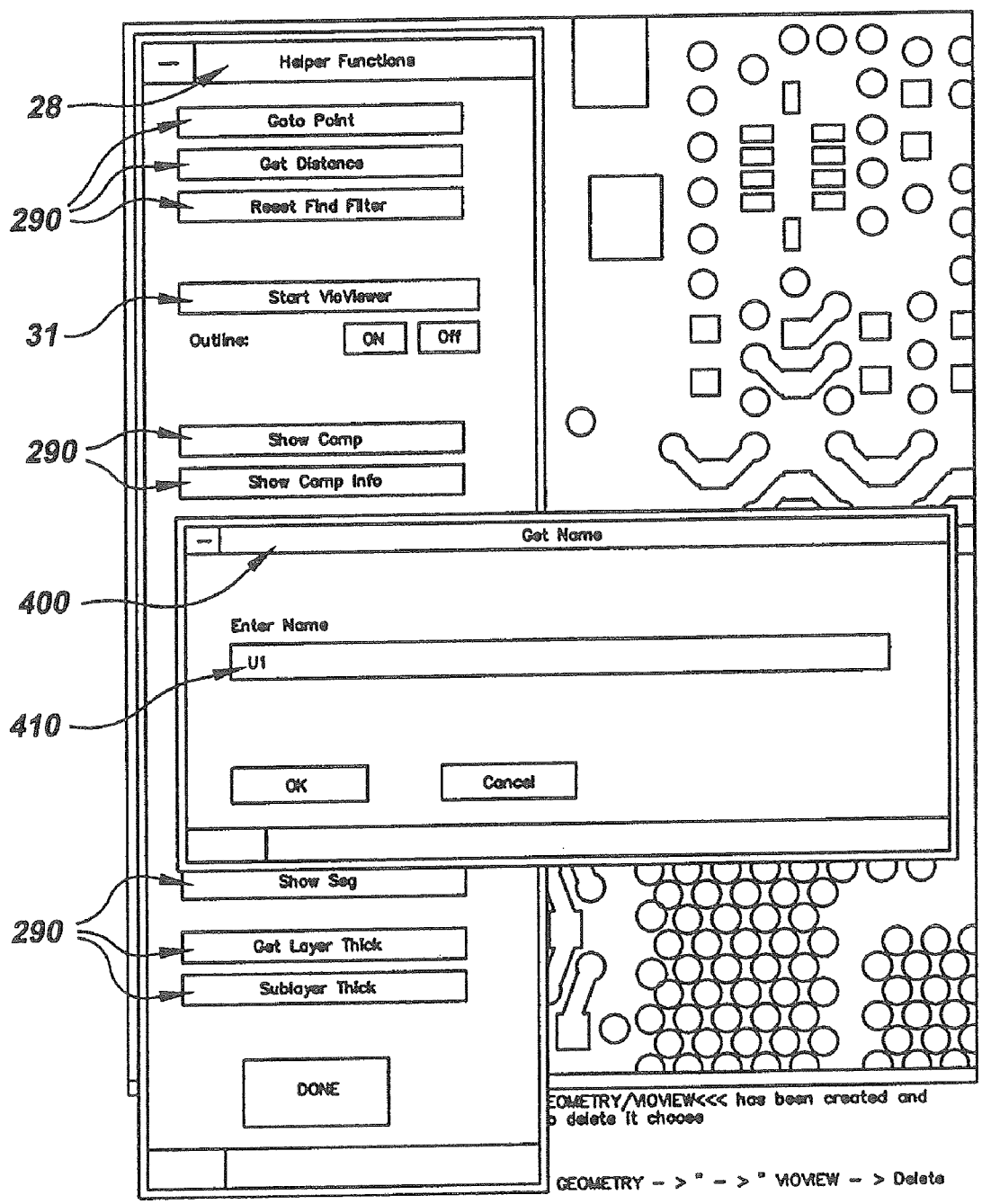
FIG. 14 depicts a second example of a helper function where the user may select a function that has a feature name as its input.

Since the invention relies on interacting with the design file 1 within the design tool, the features 24, 25, 26, 27 shown in FIGS. 2-6 are created as design elements in the design file 1. In order to keep these design elements 24, 25, 26, 27 from permanently altering the original design file 1, they are created on a unique layer or class 37 within the design file 1, and can be deleted from the design file 1 without permanently altering the original data. Instructions 35, 36 for removal of this layer or class 37 may be provided to the user through interaction with the design tool. FIG. 11 depicts sample instructions for the CADENCE ALLEGRO™ design tool, advising the user of the temporary layer created for viewing violations that can be safely removed without making permanent, destructive changes to the original design. An example of this layer or class 37 within the CADENCE ALLEGRO design environment is shown in FIG. 12. The layer in this example is labeled "VioView" 370. FIG. 8 showed an example of a number of helper functions 29 available via a pop-up window 28 within the invention. An example of another helper function 290 is shown in FIG. 13. In this figure, the user has selected a helper function 290 that has a bounding box as its input. A pop-up window 380 enables the user to specify the coordinates of a rectangular box 390 that the invention can draw a bounding box about and zoom in magnification. FIG. 14 is a second example of a helper function 290a where the user may select a function that has a feature name as its input. This selection displays a pop-up box 400 in which the user specifies a feature name 410. Typical operation of this helper function 290 would highlight the feature and zoom the magnification to an appropriate level.

Alternative Embodiments

The description of the present invention has thus far been based on using the invention to graphically display design rule checker output that is overlaid onto the design file within the design tool environment. Alternately, the invention may be used to output a format that is viewable in a different software program or in a common graphics format such as, but not limited to, JPEG, GIF, TIFF, BMP, HTML, and the like. The above-identified figures are examples of the invention as used with the Cadence Allegro design tool. However, the invention is not limited to one tool as long as design tool commands are driven by a software program, the invention can be used in any design tool. Through the use of a translator from one format set of instructions to another, the subset file or even the original design rule checker file can be translated to work with a design tool other than the one originally used to create the design.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of using text from a design tool to display an output to a user, said method comprising:
    graphically displaying said output from said text of said design tool;
    graphically listing design rule violations;
    displaying said output as part of a software layer of said design tool such that no permanent changes are made to any original design file;

requesting that particular violations be saved in a subset output file;

generating and annotating said subset output file for use by other users such that said subset output file contains only said particular violations said user requested to be saved;

generating said subset output file in a form that allows said subset output file to be applied against the design file;

generating software help functions allowing said user to gain information about design rule violations; and iterating this process using said subset output file through a rule checking process as many times as necessary to remove said particular violations.

2. The method of claim 1 wherein said design tool is a design rule checking system.

3. The method of claim 1 wherein said text comprises text output from said design tool.

4. The method of claim 3 wherein said text output from said design tool comprises an input file for software implementing said method.

5. The method of claim 1 including representing said output as part of said software layer of said design tool, and deleting said output when no longer required.

6. The method of claim 5 including having said software layer presented in a pop-up window display.

7. The method of claim 6 wherein said pop-up window further includes information identifying said design rule violations, net name, component name, information relating to design rules.

8. The method of claim 7 wherein said pop-up window further comprises the identification of parameters being checked along with information as to said parameters' importance.

9. The method of claim 1 including drawing a bounding box around any of said design rule violations.

10. The method of claim 1 including loading and viewing said subset output file without running said design tool rule checker.

11. The method of claim 1 wherein said subset file includes saved information relating to an identified violation.

12. The method of claim 11 further including electronically sharing said saved information with different users.

13. The method of claim 1 wherein said software help functions include highlighting, zooming, measuring cumulative distance between multiple points, changing viewpoints of a design, changing magnification level, changing feature visibility, and changing location of a viewport.

14. The method of claim 1 further comprising reselecting said design rule violations to return to an originally presented view.

15. A method of viewing violations identified by a design rule checker comprising:

inputting text output from said design rule checker into a software program routine for viewing said violations;

inputting design file information into said software program routine;

generating a subset output file of said violations for a user to view;

requesting that particular violations be saved in said subset output file such that said subset output file contains only said particular violations said user requested to be saved;

generating said subset output file in a form that allows said subset output file to be applied against the design file;

editing said design file based on said violations; and iterating this process using said subset output file through said design rule checker process as many times as necessary to remove said particular violations.

16. The method of claim 15 further comprising:

inputting design data and rule checker parameters into a design rule checking tool; and performing design rule checking.

17. The method of claim 15 including generating a subset text output file of said violations.

18. The method of claim 15 including representing said output as part of a software layer of said design rule checker, and deleting said output when no longer required.

19. The method of claim 18 including having said software layer presented in a pop-up window display.

20. A program storage device readable by a machine, tangibly embodying a program of instructions executable by the machine to perform method steps for using text from a design tool to display an output to a user, said method steps comprising:

graphically displaying said output from said text of said design tool;

graphically listing design rule violations;

displaying said output as part of a software layer of said design tool such that no permanent changes are made to any original design file;

requesting that particular violations be saved in a subset output file;

generating and annotating said subset output file for use by other users such that said subset output file contains only said particular violations said user requested to be saved;

generating said subset output file in a form that allows said subset output file to be applied against the design file;

generating software help functions allowing said user to gain information about design rule violations; and iterating this process using said subset output file through a rule checking process as many times as necessary to remove said particular violations.

21. The program storage device of claim 20 wherein said text comprises text output from said design tool.

22. The program storage device of claim 21 wherein said text output from said design tool comprises an input file for software implementing said method.

23. The program storage device of claim 20 including representing said output as part of said software layer of said design tool, and deleting said output when no longer required.

24. The program storage device of claim 23 including having said software layer presented in a pop-up window display.

25. A program storage device readable by a machine, tangibly embodying a program of instructions executable by the machine to perform method steps for viewing violations identified by a design rule checker, said method steps comprising:

inputting text output from said design rule checker into a software program routine for viewing said violations;

inputting design file information into said software program routine;

requesting that particular violations be saved in a subset output file;

generating said subset output file of said violations for a user to view such that said subset output file contains only said particular violations said user requested to be saved;

generating said subset output file in a form that allows said subset output file to be applied against the design file;

editing said design file based on said violations; and iterating this process using said subset output file through said design rule checker process as many times as necessary to remove said particular violations.

26. The method of claim 25 including generating a subset text output file of said violations.

* * * * *